(12) United States Patent
Park et al.

(10) Patent No.: US 7,766,499 B2
(45) Date of Patent: Aug. 3, 2010

(54) LIGHT SOURCE UNIT, BACKLIGHT UNIT AND LIQUID CRYSTAL DISPLAY INCLUDING THE SAME, AND METHOD THEREOF

(75) Inventors: Jin Hee Park, Chungcheongnam-Do (KR); Jung Tae Kang, Gyeonggi-Do (KR); Jin Ho Ha, Gyeonggi-Do (KR); Hyun Chul Bae, Gyeonggi-Do (KR); Joo Young Kim, Chungcheongnam-Do (KR)

(73) Assignee: Samsung Electronics Co., Ltd. (KR)

( * ) Notice: Subject to any disclaimer, the term of this patent is extended or adjusted under 35 U.S.C. 154(b) by 218 days.

(21) Appl. No.: 11/936,501

(22) Filed: Nov. 7, 2007

(65) Prior Publication Data

US 2008/0106898 A1  May 8, 2008

(30) Foreign Application Priority Data

Nov. 7, 2006 (KR) .................. 10-2006-0109639

(51) Int. Cl.
  *G09F 13/04* (2006.01)
  *G02F 1/13357* (2006.01)
  *H01R 33/09* (2006.01)

(52) U.S. Cl. ............... 362/97.3; 362/249.02; 362/612; 362/631; 362/646; 361/773; 361/760; 439/56; 439/68; 439/751

(58) Field of Classification Search ............ 362/97.3, 362/249.02, 612, 631, 646; 361/760, 773; 439/56, 68, 751
See application file for complete search history.

(56) References Cited

U.S. PATENT DOCUMENTS 5,068,771 A * 11/1991 Savage, Jr. .......... 362/255
5,726,862 A * 3/1998 Huynh et al. ........ 361/773
6,152,568 A 11/2000 Baba et al.
6,252,350 B1 6/2001 Alvarez
6,386,733 B1 * 5/2002 Ohkohdo et al. ..... 362/249.06
6,923,548 B2 * 8/2005 Lim .................... 362/612
7,341,371 B2 * 3/2008 Kuo et al. ............ 362/659
2002/0036464 A1 3/2002 Takahashi et al.
2002/0117954 A1 8/2002 Nagano et al.
2004/0004227 A1 1/2004 Tateishi
2006/0076570 A1 4/2006 Chen et al.

FOREIGN PATENT DOCUMENTS

| JP | 5048150 | 2/1993 |
| JP | H6-7184 | 1/1994 |
| JP | 7297452 | 11/1995 |
| JP | 8221008 | 8/1996 |
| JP | 10289971 | 10/1998 |
| JP | 2001044507 | 2/2001 |
| JP | 2005311102 | 11/2005 |
| KR | 20-1999-1425 | 1/1999 |

(Continued)

*Primary Examiner*—Stephen F Husar
*Assistant Examiner*—James W Cranson
(74) *Attorney, Agent, or Firm*—Cantor Colburn LLP

(57) ABSTRACT

A light source unit including light emitting diodes mounted on a printed circuit board by not using a soldering method but a fitting method, and a backlight unit and liquid crystal display including the light source unit. The light source unit includes light emitting diodes including lead terminals and a printed circuit board including a fitting hole. Each of the lead terminals includes a base part and a fitting part protruding from the base part. The fitting part of the light emitting diode is fitted into the fitting hole of the printed circuit board and so that the light emitting diode is mounted on the printed circuit board.

18 Claims, 10 Drawing Sheets

FOREIGN PATENT DOCUMENTS

| | | |
|---|---|---|
| KR | 20-1999-23242 | 7/1999 |
| KR | 20-2000-5595 | 3/2000 |
| KR | 1020020052785 A | 7/2002 |
| KR | 20-359158 | 8/2004 |
| KR | 1020040080626 A | 9/2004 |
| KR | 1020060002326 A | 1/2006 |
| KR | 1020060053468 A | 5/2006 |
| KR | 1020060083676 A | 7/2006 |

* cited by examiner

LIGHT SOURCE UNIT, BACKLIGHT UNIT AND LIQUID CRYSTAL DISPLAY INCLUDING THE SAME, AND METHOD THEREOF

This application claims priority to Korean Patent Application No. 10-2006-0109639 filed on Nov. 7, 2006 and all the benefits accruing therefrom under 35 U.S.C. §119, the contents of which are herein incorporated by reference in its entirety.

BACKGROUND OF THE INVENTION

1. Field of the Invention

The present invention relates to a light source unit, a backlight unit and liquid crystal display including the light source unit, and more particularly, to a light source unit in which light emitting diodes are mounted on a printed circuit board by not using a soldering method but a fitting method, and a backlight unit and liquid crystal display including the light source unit.

2. Description of the Related Art

Light bulbs, light emitting diodes ("LEDs"), fluorescent lamps, metal halide lamps, or the like are widely used as a light source of a backlight unit for a liquid crystal display. A backlight unit using LEDs (light emitting diodes) has been developed as a light source for a liquid crystal display. The backlight unit using light emitting diodes has smaller power consumption, weight, size, and thickness as compared to a backlight unit using CCFLs (cold cathode fluorescent lamps) in the related art. The backlight unit using light emitting diodes uses a light emitting diode array as a light source. The light emitting diode array includes a plurality of light emitting diodes that is arrayed in a line or in a matrix on a printed circuit board.

The light emitting diode may be mounted on the printed circuit board by soldering. If defects occur in the light emitting diode, it is not possible to remove the defective light emitting diode due to the solders. Therefore, there is a problem in that the entire light source unit is required to be replaced with another one. Further, as environmental regulations are of concern, the use of solder has been limited. Accordingly, it is necessary to consider an alternative to solder in respect to the environmental regulations.

BRIEF SUMMARY OF THE INVENTION

An exemplary embodiment provides a light source unit in which light emitting diodes are mounted on a printed circuit board by using not a soldering method but a fitting method, and a backlight unit and liquid crystal display including the light source unit.

In an exemplary embodiment of, a light source unit includes light emitting diodes including a lead terminal and a printed circuit board including a fitting hole. The lead terminal includes a base part and a fitting part protruding from the base part. The fitting part of the lead terminal is fitted into the fitting hole of the printed circuit board and the light emitting diode is mounted on the printed circuit board.

In an exemplary embodiment of the light source unit, the fitting part may include a protruding portion that protrudes from the base part in one direction and is inserted into the fitting hole, and a head portion that is formed at a distal end of the protruding portion and connects the lead terminal to the printed circuit board.

In an exemplary embodiment of the light source unit, the protruding portion may include a first body and a second body spaced apart from the first body. A first end of the first body is connected to a first end of the head portion, and a first end of the second body is connected to a second end of the head portion. Further, the base part extends from a second end of the first body in a first direction, and extends from a second end of the second body in a second direction opposite to the first direction.

In an exemplary embodiment of the light source unit, the protruding portion may include a first body formed on one surface of the base part, and a second body that is spaced apart from the first body and formed on the one surface of the base part.

In an exemplary embodiment of the light source unit, the head portion may connect a distal end of the first body and a distal end of the second body.

In an exemplary embodiment of the light source unit, the head portion may include a first head formed at a distal end of the first body, and a second head formed at a distal end of the second body.

In an exemplary embodiment of the light source unit, the protruding portion may include three or more bodies that are formed on one surface of the base part and spaced apart from each other, and the head portion includes three or more heads formed at distal ends of the bodies.

In an exemplary embodiment of the light source unit, the lead terminal may include a first lead terminal and a second lead terminal.

In an exemplary embodiment of the light source unit, the head portion may have a shape in which a width is gradually decreased from a first end toward a second end of the head portion.

In an exemplary embodiment of the light source unit, each of the lead terminals may include a plurality of fitting parts.

In an exemplary embodiment of the light source unit, the fitting hole of the printed circuit board may include a first fitting hole into which the fitting part of the first lead terminal is fitted, a second fitting hole into which the fitting part of the second lead terminal is fitted, and a third fitting hole through which a molding part or substrate of the light emitting diode passes.

In an exemplary embodiment of the light source unit, the printed circuit board may include circuit patterns, and the first fitting hole and the second fitting hole may be formed in the circuit patterns.

In an exemplary embodiment of the light source unit, the circuit patterns may extend into the first fitting hole and the second fitting hole.

In an exemplary embodiment of the light source unit, the first lead terminal may include a first base part, a first protruding portion, and a first head portion. Further, the second lead terminal may include a second base part, a second protruding portion, and a second head portion.

In an exemplary embodiment of the light source unit, the first protruding portion and the second protruding portion may protrude toward a molding part of the light emitting diode.

In an exemplary embodiment of the light source unit, the first protruding portion and the second protruding portion may protrude toward the side opposite to a molding part of the light emitting diode.

In an exemplary embodiment of the light source unit, the first protruding portion and the second protruding portion may be symmetric with each other.

In an exemplary embodiment, a backlight unit and liquid crystal display may include the above-mentioned light source unit.

In an exemplary embodiment, a method of manufacturing a backlight unit provides forming a light source unit including light emitting diodes and a printed circuit board in which a fitting hole is disposed, the light emitting diodes including a lead terminal, the lead terminal including a base part and a fitting part protruding from the base part and inserting the fitting part of the lead terminal into the fitting hole of the printed circuit board. The inserted fitting part of the light emitting diode secures the light emitting diode to the printed circuit board and electrically connects the light emitting diode to the printed circuit board.

In an exemplary embodiment, the forming a light source may include forming circuit pattern on a side of the printed circuit board. The inserted fitting part contacts the circuit pattern.

In an exemplary embodiment, the forming a light source may further include forming the light emitting diodes including a molding part and a light emitting chip, the molding part enclosing the light emitting chip. Further, the circuit pattern is formed on a same side of the printed circuit board as the molding part.

In an exemplary embodiment, the circuit pattern is formed on a side of the printed circuit board opposite to the molding part.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE INVENTION

Figure 1:
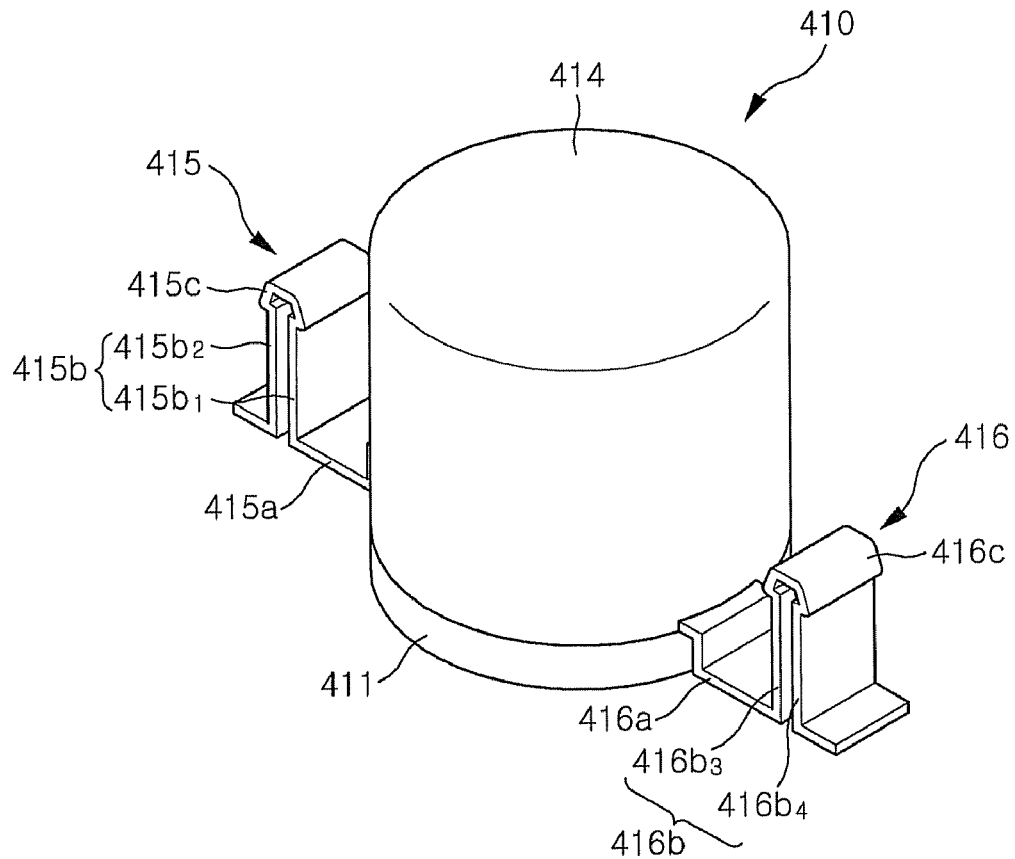
FIG. 1 is a perspective view of an exemplary embodiment of a light emitting diode according to the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on, connected or coupled to another element or layer or intervening elements or layers. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below", "lower", "above", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "lower" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, preferred embodiments of the present invention will be described in detail with reference to the accompanying drawings.

Figure 2:
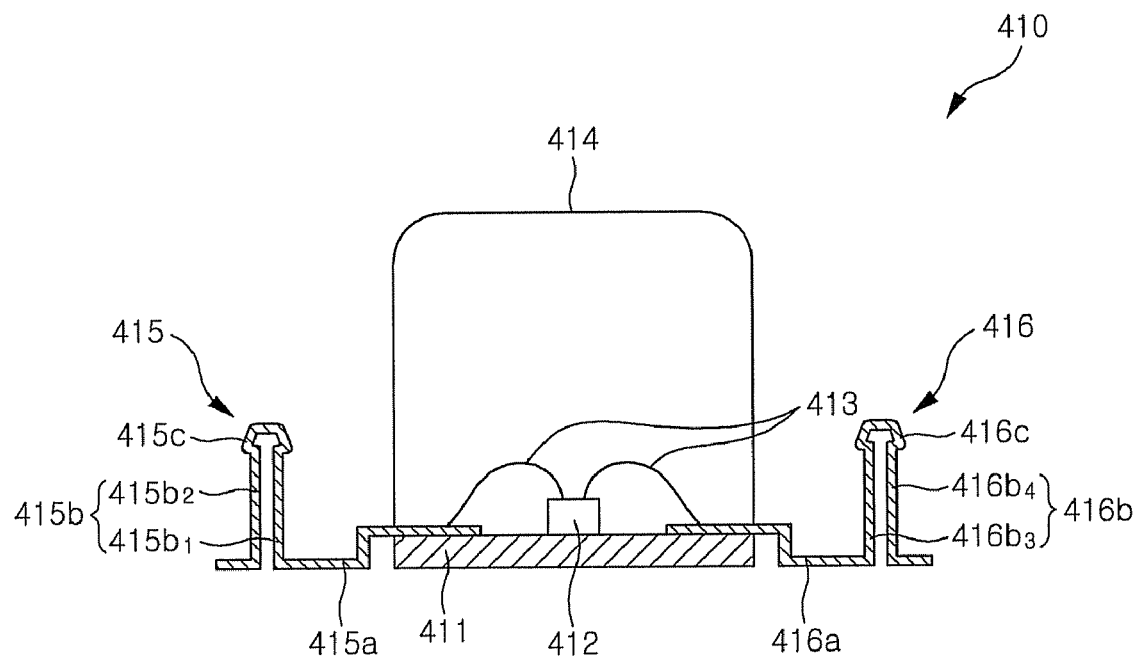
FIG. 2 is a cross-sectional view of the light emitting diode of FIG. 1 according to the present invention.

FIG. 1 is a perspective view of an exemplary embodiment a light emitting diode according to the present invention, and FIG. 2 is a cross-sectional view of the light emitting diode of FIG. 1 according to the present invention.

Referring to FIGS. 1 and 2, a light emitting diode 410 according to the present invention includes a substrate 411, a light emitting chip 412, wires 413, a molding part 414, a first lead terminal 415, and a second lead terminal 416.

The light emitting chip 412 is mounted on the substrate 411. In an exemplary embodiment, the light emitting chip 412 is a semiconductor P-N junction diode. When P- and N-type semiconductors are joined to each other and a voltage is then applied to the semiconductors, holes of the P-type semiconductor move toward the N-type semiconductor and gather at a central portion. In contrast, electrons of the N-type semiconductor move toward the P-type semiconductor and gather at the central portion that has the lowest energy at a conduction band. The electrons naturally fall into holes of a valence band. The electrons emit energy corresponding to the difference in height between the conduction band and valence band, that is, an energy gap in the form of light.

In exemplary embodiments, various types of light emitting chips may be used other than the above-mentioned light emitting chip 412. Further, the light emitting chip 412 can emit light having various wavelengths. For this purpose, the content of indium (In) used as the material of an active layer in a, for example, nitride-based light emitting diode may be adjusted, light emitting diodes for emitting light having different wavelengths may be combined with each other, or light emitting chips for emitting light having a predetermined wavelength band and phosphors are combined with each other.

The first lead terminal 415 and the second lead terminal 416 are provided on the substrate 411, and the wires 413 connect the light emitting chip 412 to the first lead terminal 415 and the second lead terminal 416, respectively. When power is applied to the first lead terminal 415 and the second lead terminal 416 from outside, the power is supplied to P and N electrode (not shown) of the light emitting chip 412 through the wires 413. As a result, the light emitting chip 412 emits light having a predetermined wavelength.

A molding part 414, which seals or encloses the light emitting chip 412 and the wires 413, is formed on the substrate 411. In exemplary embodiments, the molding part 414 may be formed in various shapes, such as, in the shape of an optical lens and in the shape of a plate. As illustrated in FIGS. 1 and 2, the molding part 414 is formed in a substantially cylindrical. In an exemplary embodiment, the molding part 414 may be made of a transparent resin, such as, liquid epoxy resin, silicon resin, or the like. Phosphors (not shown), which absorb light emitted from the light emitting chip 412 and convert the wavelength of the light into various wavelengths, may be mixed in the molding part 414.

The first lead terminal 415 includes a first base part 415a and a first fitting part that protrudes from the first base part 415a. The first fitting part includes a first protruding portion 415b that protrudes from the first base part 415a toward an upper side, e.g., toward and in a similar direction as the molding part 414, and a first head portion 415c formed at the end of the first protruding portion 415b.

The first protruding portion 415b is inserted into a fitting hole of a printed circuit board to be described below, and the first head portion 415c passes through the fitting hole and fits the first lead terminal 415 to the printed circuit board.

In the illustrated embodiment, the first head portion 415c has a shape in which a width is gradually decreased from one end toward the other end (e.g., in a vertical direction), and is formed symmetrically about a central axis, such as, in the shape of an arrow-head. Further, the first protruding portion 415b includes a first body $415b_1$, and a second body $415b_2$ spaced apart from the first body $415b_1$ (e.g., in a horizontal direction). A first end of the first body $415b_1$ is connected to a first end of the first head portion 415c, and a first end of the second body $415b_2$ is connected to a second end of the first head portion 415c. Further, a portion of the first base part 415a extends from a second end of the first body $415b_1$ in a first direction, e.g., in a direction toward the light emitting chip 412. Furthermore, a remaining portion of the first base part 415a extends from a second end of the second body $415b_2$ in a second direction that is opposite to the first direction. In an exemplary embodiment, the first lead terminal 415 may be formed of a single conductive plate so that the first base part 415a, the first protruding portion 415b, and the first head portion 415c are continuously connected to each other, e.g., integrally formed.

The second lead terminal 416 is symmetric with the first lead terminal 415. The second lead terminal 416 includes a second base part 416a and a second fitting part that protrudes from the second base part 416a. The second fitting part includes a second protruding portion 416b that protrudes from the second base part 416a toward the upper side, e.g., toward the molding part 414, and a second head portion 416c formed at the end of the second protruding portion 416b.

The second protruding portion 416b is inserted into a fitting hole of a printed circuit board to be described below, and the second head portion 416c passes through the fitting hole and fits the second lead terminal 416 to the printed circuit board. In the illustrated embodiment, the second head portion 416c has a shape in which a width is gradually decreased from one end toward the other end, e.g., in a direction away from the distal end of the fitting part.

Further, the second protruding portion 416b includes a third body 416$b_3$, and a fourth body 416$b_4$ spaced apart from the third body 416$b_3$. A first end of the third body 416$b_3$ is connected to a first end of the second head portion 416c, and a first end of the fourth body 416$b_4$ is connected to a second end of the first head portion 416c. Further, a portion of the second base part 416a extends from a second end of the third body 416$b_3$ in a first direction, e.g., in a direction toward the light emitting chip 412. Furthermore, a remaining portion of the second base part 416a extends from a second end of the fourth body 416$b_4$ in a second direction that is opposite to the first direction.

As in the illustrated embodiment, each of the first lead terminal 415 and the second lead terminal 416 includes a fitting part. However, the present invention is not limited thereto, and each of the lead terminals may include a plurality of fitting parts. The number of fitting holes into which the fitting parts are fitted corresponds to that of the fitting parts, and the shape of each fitting hole corresponds to that of each fitting part. As used herein, "corresponds" is used to indicate corresponding substantially in shape, dimension and/or positional placement.

Figure 3:
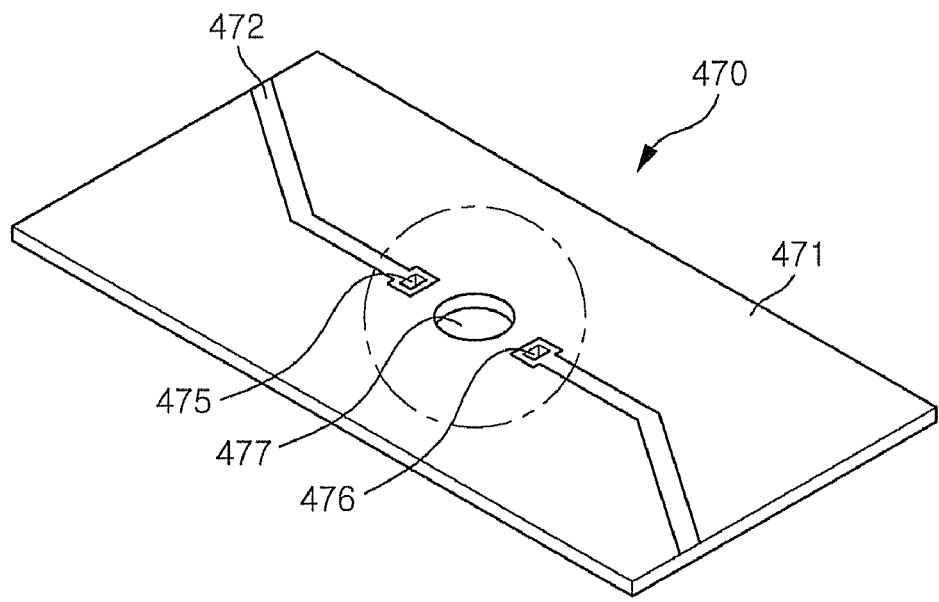
FIG. 3 is a perspective view of an exemplary embodiment of a printed circuit board on which a light emitting diode according to the present invention is mounted.
Figure 4A:
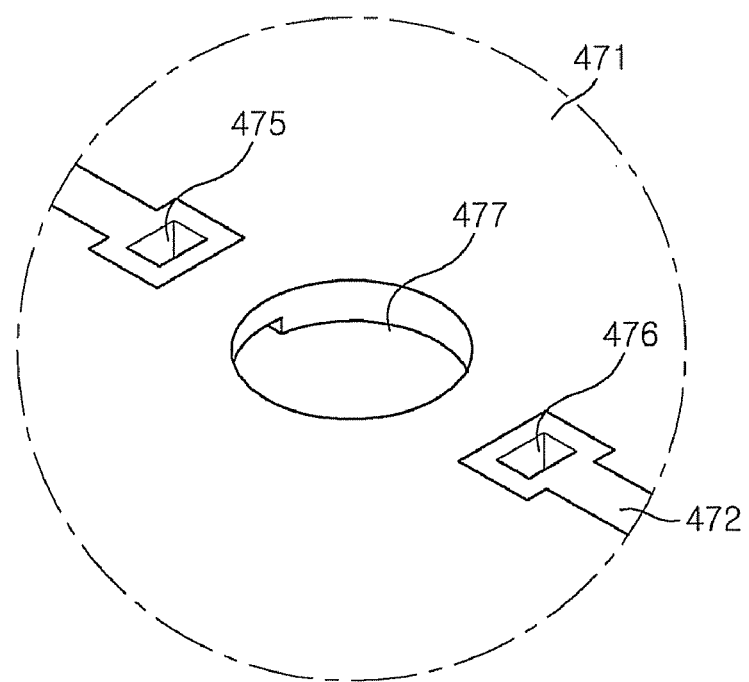
FIG. 4A is a perspective view of an upper surface of the printed circuit board shown in FIG. 3.
Figure 4B:
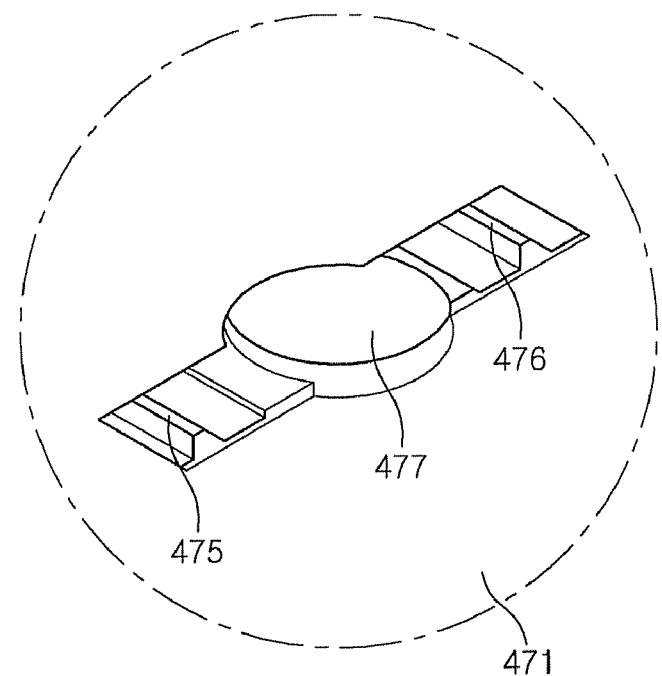
FIG. 4B is a perspective view of a lower surface of the printed circuit board shown in FIG. 3.

FIG. 3 is a perspective view of an exemplary embodiment of a printed circuit board on which a light emitting diode according to the present invention is mounted, FIG. 4A is a perspective view of an upper surface of the printed circuit board shown in FIG. 3, and FIG. 4B is a perspective view of a lower surface of the printed circuit board shown in FIG. 3.

Referring to FIGS. 3 to 4B, a printed circuit board 470 includes a base plate 471, such as made of an insulating material, circuit patterns 472 formed on the base plate 471, and a fitting hole formed in the base plate 471. The fitting hole includes first and second fitting holes 475 and 476 and a third fitting hole 477. The lead terminals of the light emitting diode 410 shown in FIGS. 1 and 2, the lead terminals including the first and second lead terminals 415 and 416, are fitted into the first and second fitting holes 475 and 476, respectively. The body of the light emitting diode, e.g., the molding part 414 and/or substrate 411 passes through the third fitting hole 477 of the printed circuit board 470.

The first fitting hole 475 and the second fitting hole 476 are formed in the base plate 471 on a region of the base plate 471 where the circuit patterns 472 are formed, and the third fitting hole 477 is formed between the first fitting hole 475 and the second fitting hole 476. As in the illustrated embodiment, the circuit patterns 472 may extend into the first fitting hole 475 and the second fitting hole 476.

Sizes and shapes of the first and second fitting holes 475 and 476 correspond to sizes and shapes of the first fitting part of the first lead terminal 415 and the second fitting part of the second lead terminal 416, respectively. A size and shape of the third fitting hole 477 corresponds to a size and shape of the molding part 414 and/or substrate 411 of the LED 410.

Various types of printed circuit boards may be used as the printed circuit board on which the light emitting diode according to the present invention is mounted. In exemplary embodiments, a rigid printed circuit board, a metal core printed circuit board, an FR4 printed circuit board (Flame Retardant Type 4 substrate, such as, a fire retardant substrate made of glass fiber and epoxy resin), or the like may be used as the printed circuit board according to the present invention.

Figure 5A:
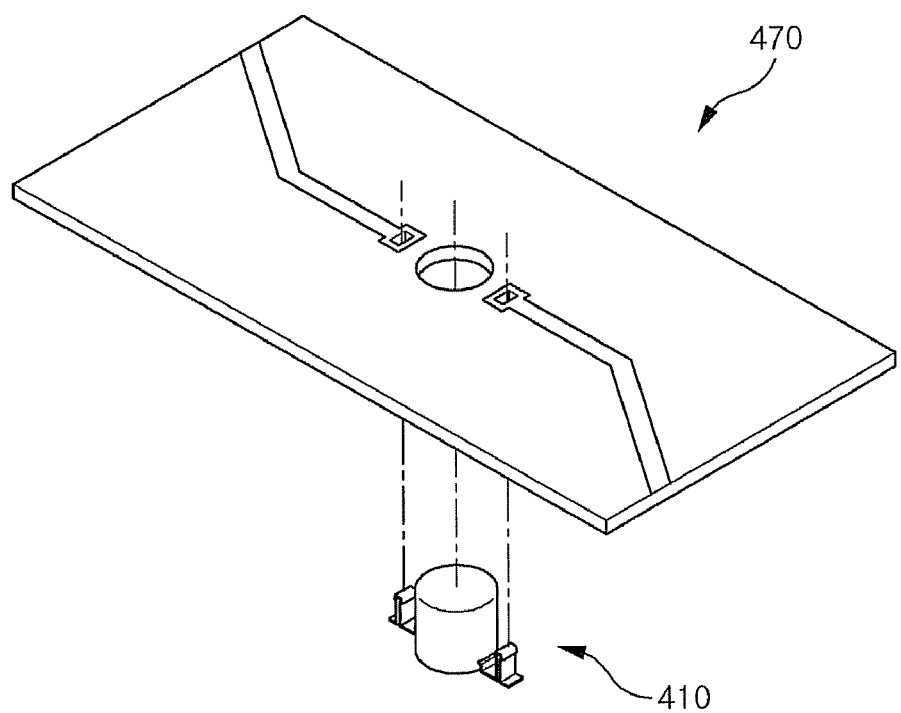
FIG. 5A is a perspective view of an exemplary embodiment of the light emitting diode and the printed circuit board of FIGS. 1-4 before the light emitting diode and the printed circuit board are united with each other.
Figure 5B:
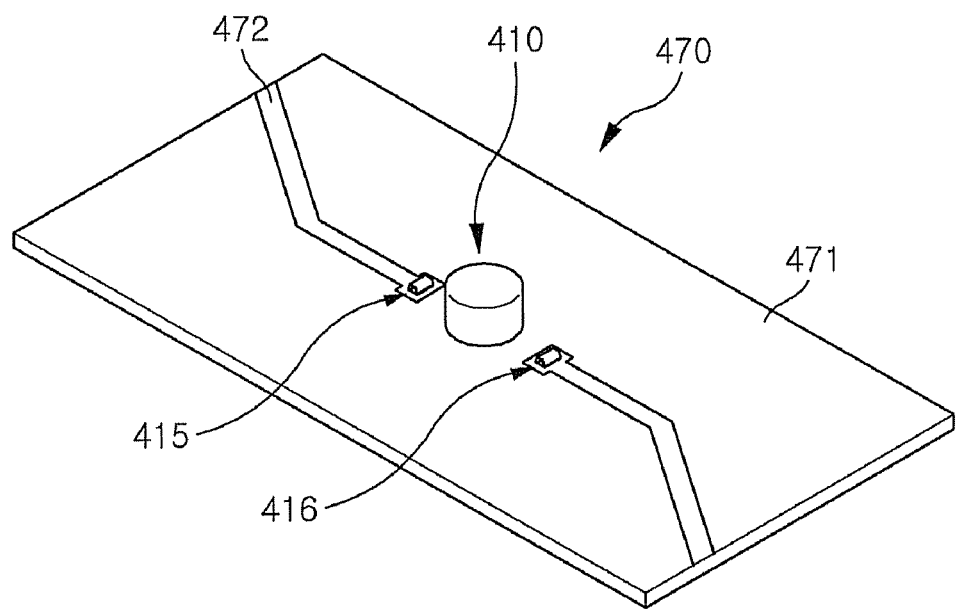
FIG. 5B is a perspective view of an exemplary embodiment of the light emitting diode and the printed circuit board of FIGS. 1-4 after the light emitting diode and the printed circuit board are united with each other.
Figure 5C:
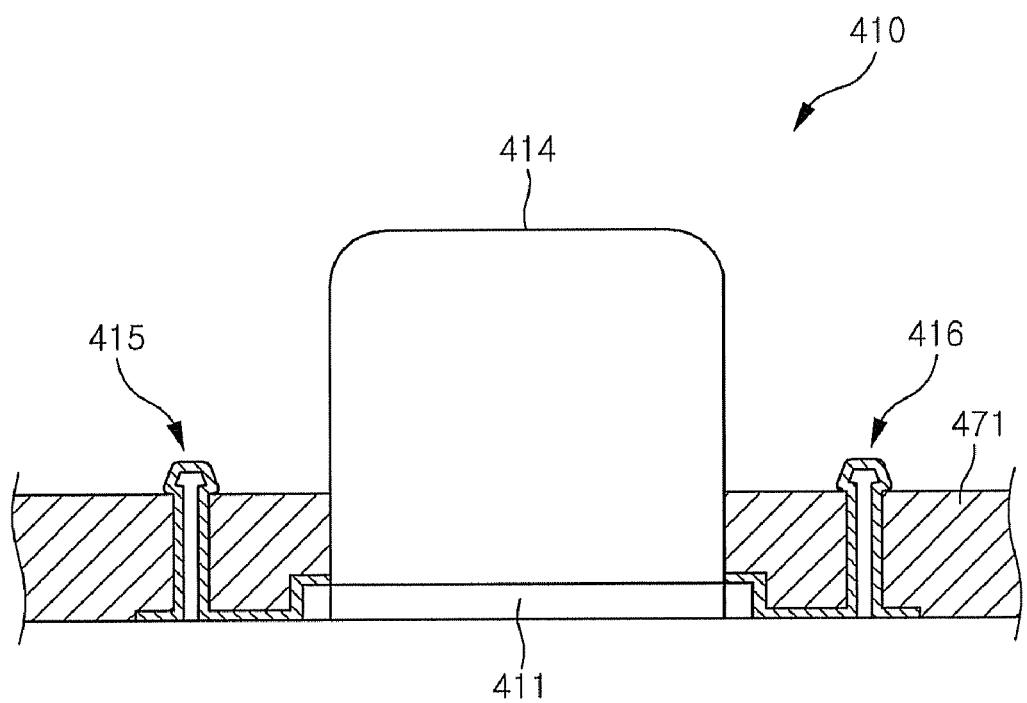
FIG. 5C is a cross-sectional view of FIG. 5B.

FIG. 5A is a perspective view of an exemplary embodiment of the light emitting diode and the printed circuit board of FIGS. 1-4 before the light emitting diode and the printed circuit board are united with each other, FIG. 5B is a perspective view of an exemplary embodiment of the light emitting diode and the printed circuit board of FIGS. 1-4 after the light emitting diode and the printed circuit board are united with each other, and FIG. 5C is a cross-sectional view of FIG. 5B.

Referring to FIGS. 5A to 5C, a light source unit includes the light emitting diode 410 and the printed circuit board 470 on which the light emitting diode 410 is mounted.

As shown in FIGS. 1 and 2, the light emitting diode 410 includes the substrate 411, the light emitting chip 412, the wires 413, the molding part 414, the first lead terminal 415 that includes of the first base part 415a and the first fitting part, and the second lead terminal 416 that includes the second base part 416a and the second fitting part.

As shown in FIGS. 3 to 4b, the printed circuit board 470 includes the base plate 471, the circuit patterns 472 formed on a surface of the base plate 471 (e.g., such as the single upper surface), and the first to third fitting holes 475, 476, and 477 that are formed in the base plate 471.

In the illustrated embodiment, the light emitting diode 410 is combined with the printed circuit board 470 from the rear side of the printed circuit board 470. The light emitting diode 410 is aligned with the printed circuit board 470 so as to be combined with the printed circuit board 470 from one surface of the printed circuit board 470, e.g., the surface of the printed circuit board opposite to the surface thereof on which the circuit patterns 472 are formed, toward an opposing surface of the printed circuit board, e.g., where the circuit patterns are formed 472. The first fitting part of the first lead terminal 415 of the light emitting diode 410 is fitted into the first fitting hole 475 of the printed circuit board 470, and the second fitting part of the second lead terminal 416 is fitted into the second fitting hole 476 of the printed circuit board 470. The molding part 414 passes through the third fitting hole 477, and is disposed on one surface of the printed circuit board, e.g., a front surface such as where the circuit patterns 472 are formed.

The operation and state in which the first and second lead terminals 415 and 416 of the light emitting diode 410 are combined with the printed circuit board 470 will be described below in detail. In the illustrated embodiment, the lead terminals are symmetrical with each other. Accordingly, the only first lead terminal 415 will be described below.

When the first head portion 415c of the first lead terminal 415 of the LED 410 is inserted through the first fitting hole 475 of the printed circuit board 470, the first protruding portion 415b of the LED 410 is disposed in the first fitting hole 475. The first head portion 415c is disposed on a surface of the printed circuit board 470, such as, on the surface thereof on which the circuit patterns 472 are formed. The first base part 415a of the LED 410 is disposed on an opposing surface of the printed circuit board 470, such as, on the surface thereof opposite to the surface on which the circuit patterns 472 are formed (e.g., a rear side). The first lead terminal 415 is fitted into the first fitting hole 475. The first head portion 415c comes in contact with the circuit patterns 472 formed on the printed circuit board 470. A lower surface of the first head portion 415c contacts an upper surface of the printed circuit board 470 as a portion where the circuit patterns 472 are formed, as illustrated in FIG. 5C. Advantageously, the first lead terminal 415 of the LED 410 is electrically connected to the circuit patterns 472 of the printed circuit board 470 without having to perform an additional assembly step and without requiring additional parts, such as solder.

When the circuit patterns 472 extend into the first fitting hole 475, since the first protruding portion 415b of the first lead terminal 415 of the LED 410 comes in contact with the circuit patterns 472 in the first fitting hole 475 of the printed circuit board 470, the first lead terminal 415 is electrically connected to the circuit patterns 472. When the circuit patterns 472 are formed in the first fitting hole 475 as described above, a contact area between the first lead terminal 415 of the LED 410 and the circuit patterns 472 of the printed circuit board 470 is increased. Advantageously, it is possible to improve connection of the first lead terminal 415 to the circuit patterns 472. This advantage may be applied to the following embodiments.

The first head portion 415c has a shape in which a width is gradually decreased from one end toward the other end, e.g., in a direction away from the distal end of the fitting part. The first head portion 415c is considered to have a tapered shape. When the first head portion 415c has a tapered shape, the first head portion 415c has predetermined elasticity. When the first head portion 415c passes through the first fitting hole 475, a width of the first head portion 415c inserted into the first fitting hole 475 is decreased or deformed. The width decreasing is a result of the first body $415b_1$ and the second body $415b_2$ being moved toward each other as wider portions of the tapered first head portion 415c successively pass through the first fitting hole 475 in a direction from the rear side to the front side of the printed circuit board 470. As a result, it is possible to relatively easily insert the first head portion 415c into the first fitting hole 475.

After the first head portion 415c completely passes through the first fitting hole 475, the first head portion 415c is restored to the original shape, e.g., the first body $415b_1$ and the second body $415b_2$ are moved away from each other by a restoring force of the elasticity. Since the first head portion 415c is secured in the first fitting hole 475 of the printed circuit board 470, the first lead terminal 415 can be securely combined with the printed circuit board 470.

Figure 6A:
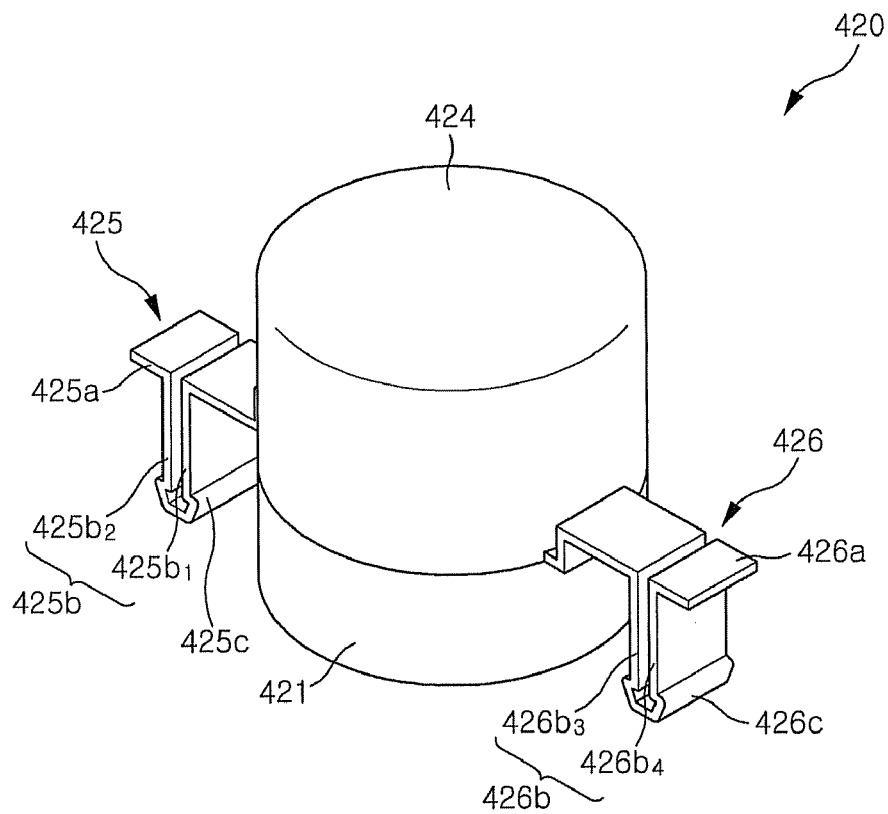
FIG. 6A is a perspective view of another exemplary embodiment of a light emitting diode according to the present invention.
Figure 6B:
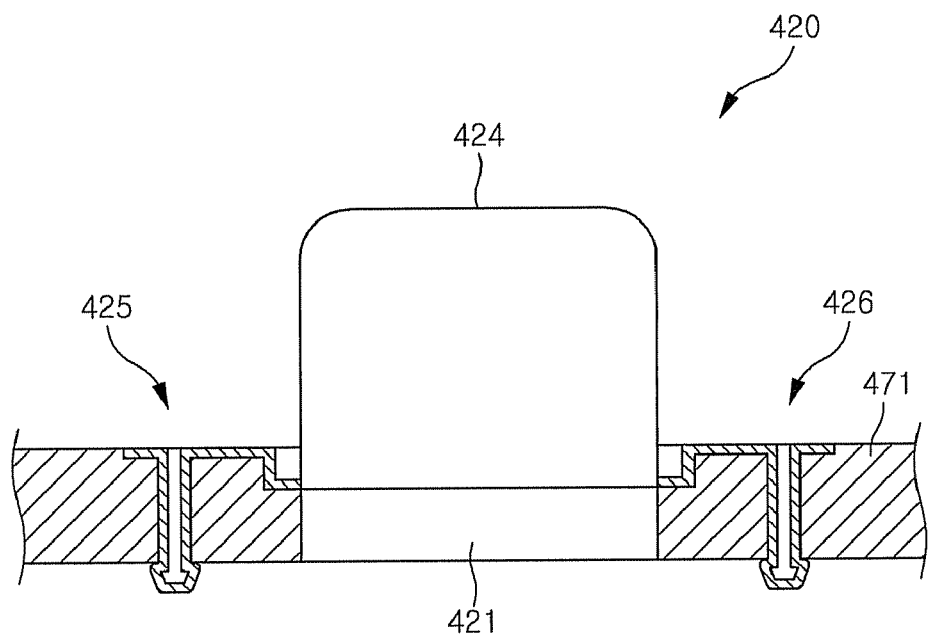
FIG. 6B is a cross-sectional view of the light emitting diode shown in FIG. 6A and a printed circuit board that are united with each other.

FIG. 6A is a perspective view of another exemplary embodiment of a light emitting diode according to the present invention, and FIG. 6B is a cross-sectional view of the light emitting diode shown in FIG. 6A and a printed circuit board that are united with each other. A light emitting diode of FIG. 6A and has substantially the same structure as the light emitting diode of FIG. 1-, except for the position of a fitting part and a direction in which a light emitting diode is combined with a printed circuit board. Accordingly, only the differences between the first and second embodiments will be described below.

Referring to FIG. 6A, a light emitting diode 420 includes a substrate 421, a light emitting chip, wires, a molding part 424, a first lead terminal 425, and a second lead terminal 426.

The first lead terminal 425 includes a first base part 425a and a first fitting part that protrudes from the first base part 425a. The first fitting part includes a first protruding portion 425b that protrudes from the first base part 425a toward a lower side, e.g., toward a side of the LED 420 opposite to the molding part 424, and a first head portion 425c formed at the end of the first protruding portion 425b.

The first protruding portion 425b is inserted into a fitting hole of a printed circuit board to be described below, and the first head portion 425c passes through the fitting hole and fits the first lead terminal 425 to the printed circuit board. In this case, the first head portion 425c has a shape in which a width is gradually decreased from one end toward the other end, e.g., in a direction of the first fitting part toward the distal end. The first protruding portion 425b includes a first body $425b_1$, and a second body $425b_2$ spaced apart from the first body $425b_1$. A first end of the first body $425b_1$ is connected to a first end of the first head portion 425c, and a first end of the second body $425b_2$ is connected to a second end of the first head portion 425c. A portion of the first base part 425a extends from a second end of the first body $425b_1$ in a first direction, e.g., in a direction toward the molding part 424. A remaining portion of the first base part 425a extends from a second end of the second body $425b_2$ in a second direction that is opposite to the first direction, e.g., away from the molding part 424 of the LED 420.

The second lead terminal 426 is symmetrical with the first lead terminal 425. The second lead terminal 426 includes a second base part 426a and a second fitting part that protrudes from the second base part 426a. The second fitting part includes a second protruding portion 426b that protrudes from the second base part 426a toward a lower side of the LED 420, e.g., toward a side opposite to the molding part 424, and a second head portion 426c formed at the end of the second protruding portion 426b. The second protruding portion 426b includes a third body $426b_3$, and a fourth body $426b_4$ spaced apart from the third body $426b_3$.

Referring to FIG. 6B, the light emitting diode 420 is combined with the printed circuit board 470 from a front side (e.g., upper side) of the printed circuit board. The light emitting diode 420 is aligned with the printed circuit board so as to be combined with the printed circuit board when the LED 420 is inserted from a single surface of the printed circuit board, such as, the surface of the printed circuit board on which the circuit patterns 472 are formed, toward the other surface of the printed circuit board, e.g., where the circuit patterns are not formed. The first fitting part of the first lead terminal 425 of the light emitting diode 420 is fitted into the first fitting hole 475 of the printed circuit board, and the second fitting part of the second lead terminal 426 is fitted into the second fitting hole 476. The substrate 421 of the LED 420 passes through the third fitting hole 477, and is disposed on a surface of the printed circuit board, such as where the circuit patterns are not formed.

The operation and state in which the first and second lead terminals 425 and 426 of the light emitting diode 420 are combined with the printed circuit board 470 will be described below in detail. In the illustrated embodiment, the lead terminals are symmetrical with each other. Accordingly, only the first lead terminal 425 will be described below.

When the first head portion 425c of the first lead terminal 425 is inserted through the first fitting hole 475 of the printed circuit board, the first protruding portion 425b is disposed in the first fitting hole 475. The first base part 425a is disposed on one surface of the printed circuit board 470, e.g., on an upper surface thereof on which the circuit patterns 472 are formed. Furthermore, the first head portion 425c of the LED 420 is disposed on another surface of the printed circuit board 470, e.g., on an opposing surface to the surface on which the circuit patterns 472 are formed. The first lead terminal 425 of the LED 420 is fitted into the first fitting hole 475 of the printed circuit board 470. The first base part 425a comes in contact with the circuit patterns 472 formed the upper surface on the printed circuit board 470. Advantageously, the first lead terminal 425 is electrically connected to the circuit patterns 472 without having to additionally solder the LED 420 to the printed circuit board 470.

In the illustrated embodiment, the circuit patterns 472 are formed on one surface, e.g., the upper surface of the printed circuit board 470. However, the invention is not limited thereto, and the circuit patterns 472 may be formed on another surface, e.g., a lower surface of the printed circuit board. When the circuit patterns 472 are formed on the lower surface of the printed circuit board, the first head portion 425c comes in contact with the circuit patterns 472. Advantageously, the LED 420 can be electrically connected to the printed circuit board 470 regardless if the circuit patterns are formed on the upper surface or the lower surface of the printed circuit board 470.

Figure 7A:
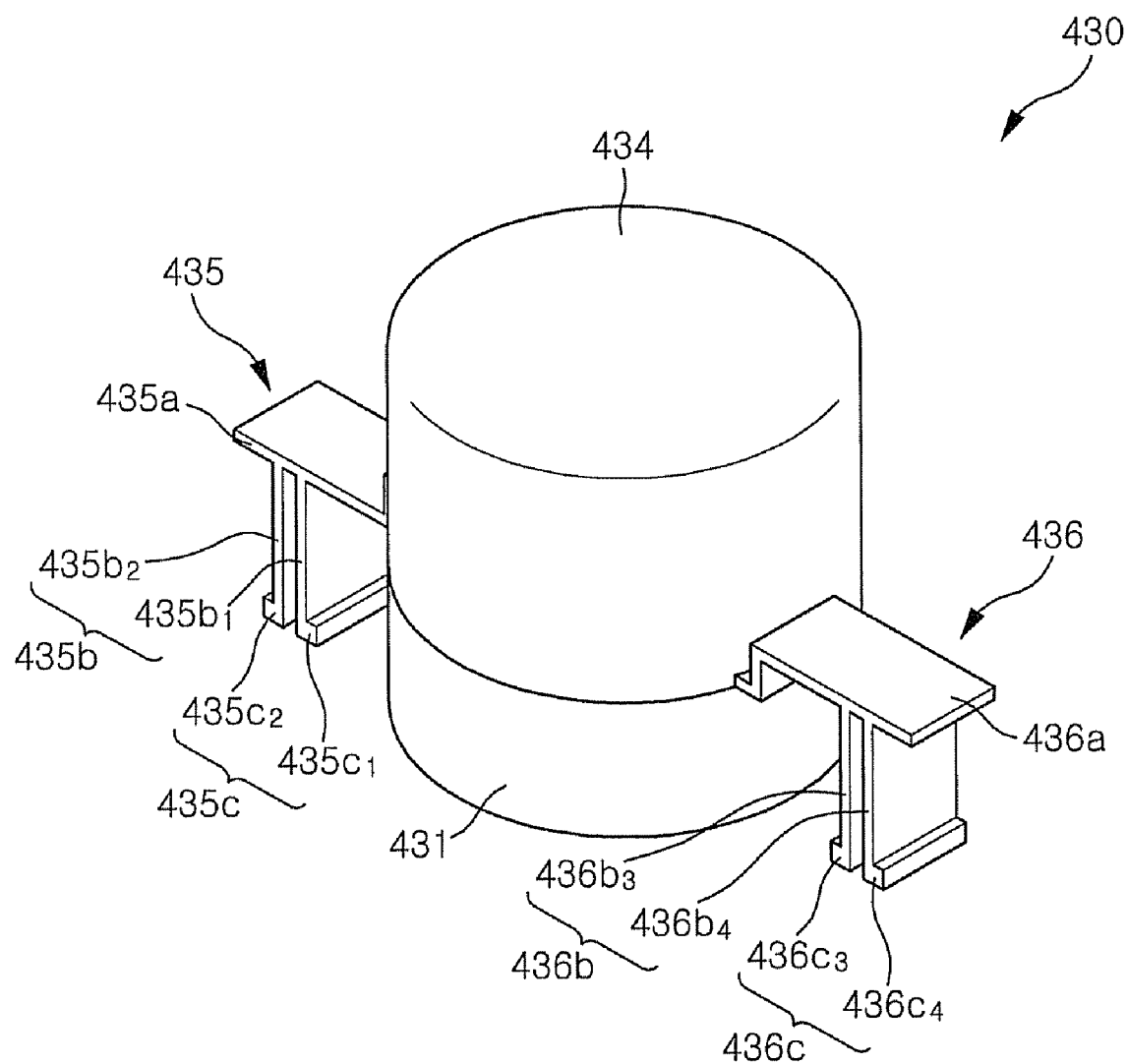
FIG. 7A is a perspective view of another exemplary embodiment of a light emitting diode according to the present invention.
Figure 7B:
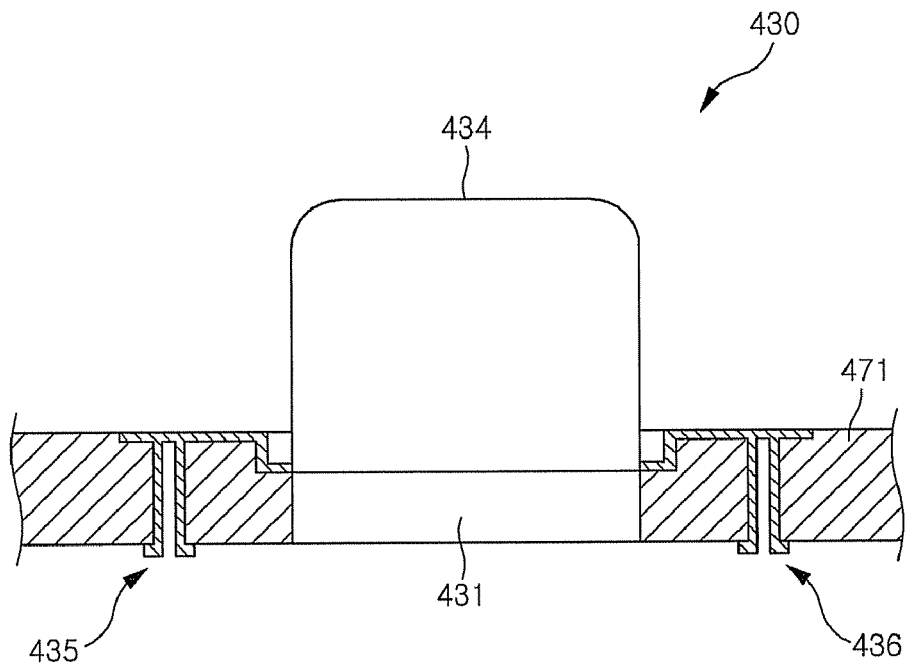
FIG. 7B is a cross-sectional view of the light emitting diode shown in FIG. 7A and a printed circuit board that are united with each other.

FIG. 7A is a perspective view of another exemplary embodiment of a light emitting diode according to the present invention, and FIG. 7B is a cross-sectional view of the light emitting diode shown in FIG. 7A and a printed circuit board that are united with each other. A light emitting diode of FIG. 7A and has substantially the same structure as the light emitting diode of FIG. 6A and, except for the shape of a fitting part. Accordingly, only differences between the LED's of FIGS. 6A/6B and 7A/will be described below.

Referring to FIG. 7A, a light emitting diode 430 includes a substrate 431, a light emitting chip, wires, a molding part 434, a first lead terminal 435, and a second lead terminal 436.

The first lead terminal 435 includes a first base part 435a and a first fitting part that protrudes from the first base part 435a. The first fitting part includes a first protruding portion 435b that protrudes from the first base part 435a toward the lower side, e.g., toward the side opposite to the molding part 434, and a first head portion 435c formed at the end of the first protruding portion 435b.

The first protruding portion 435b includes a first body $435b_1$ and a second body $435b_2$. The first body $435b_1$ is formed on one surface, e.g., the lower surface of the first base part 435a. Further, the second body $435b_2$ is formed on the lower surface of the first base part 435a and spaced apart from the first body $435b_1$.

The first head portion 435c includes a first head $435c_1$ and a second head $435c_2$. The first head $435c_1$ protrudes from the end of the first body $435b_1$ in a lateral direction, e.g., substantially perpendicular to the first body $435b_1$. The second head $435c_2$ protrudes from the end of the second body $435b_2$ in a lateral direction, e.g., substantially perpendicular to the second body $435b_2$. The second protruding portion 436b includes a third body $436b_3$, and a fourth body $436b_4$ spaced apart from the third body $436b_3$.

As in the illustrated embodiment, the first head portion 435c is formed at the ends of the first and second bodies $435b_1$ and $435b_2$, respectively. However, the present invention is not limited thereto. Alternatively, the first head portion 435c may connect the distal end of the first body $435b_1$ to the end of the second body $435b_2$, e.g., forming the first head portion 435c as described in FIGS. 1-6.

The second head portion 436c includes a third head $436c_3$ and a fourth head $435c_4$. The third head $435c_3$ protrudes from the end of the third body $436b_3$ in a lateral direction, e.g., substantially perpendicular to the third body $435b_3$. The fourth head $435c_4$ protrudes from the end of the fourth body $435b_4$ in a lateral direction, e.g., substantially perpendicular to the fourth body $435b_4$.

As illustrated in FIGS. 7A and 7B, the first protruding portion 435b includes two bodies. However, the present invention is not limited thereto, and the first and/or protruding portion 435b and 436b may include three or more bodies that are spaced apart from each other. Alternatively, the first and/or second head portion 435c and 436c may include three or more heads that are formed at the ends of the bodies, respectively. In an exemplary embodiment with three or more bodies and/or head portions, the head portions may extend in same or different lateral directions from the bodies, so long as the head portions are configured to connect the light emitting diode to the printed circuit board. A body portion of the three or more bodies may not have a head portion disposed at a distal end thereof.

Referring to FIG. 7B, the light emitting diode 430 is combined with the printed circuit board 470 from the front side of the printed circuit board 470. When the first head portion 435c of the first lead terminal 435 of the light emitting diode 430 is inserted through the first fitting hole 475 of the printed circuit board 470, the first protruding portion 435b is disposed in the first fitting hole 475. The first base part 435a is disposed on the upper surface of the printed circuit board 470, e.g., on the surface thereof on which the circuit patterns 472 are formed.

The first head portion 435c is disposed on the lower surface of the printed circuit board 470, e.g., on the surface thereof opposite to the surface on which the circuit patterns 472 are formed. The first lead terminal 435 is fitted into the first fitting hole 475 of the printed circuit board 470. The first base part 435a comes in contact with the circuit patterns 472 formed on the printed circuit board 470. As a result, the first lead terminal 435 of the LED 430 is electrically connected to the circuit patterns 472 of the circuit board 470 without having to additionally solder the components together.

Figure 8A:
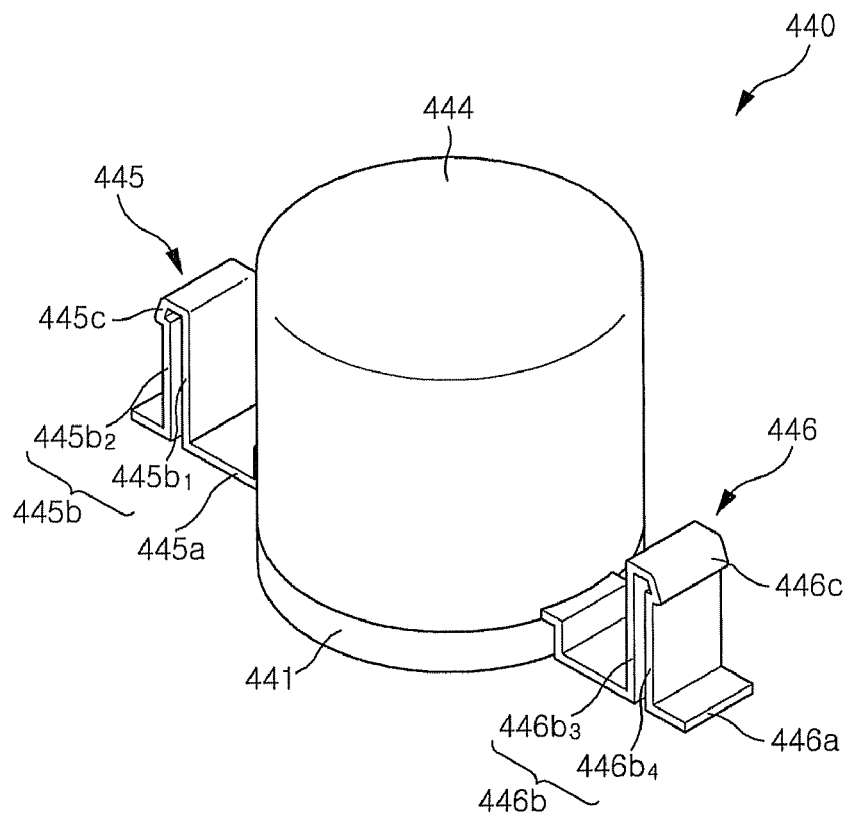
FIG. 8A is a perspective view of another exemplary embodiment of a light emitting diode according to the present invention.
Figure 8B:
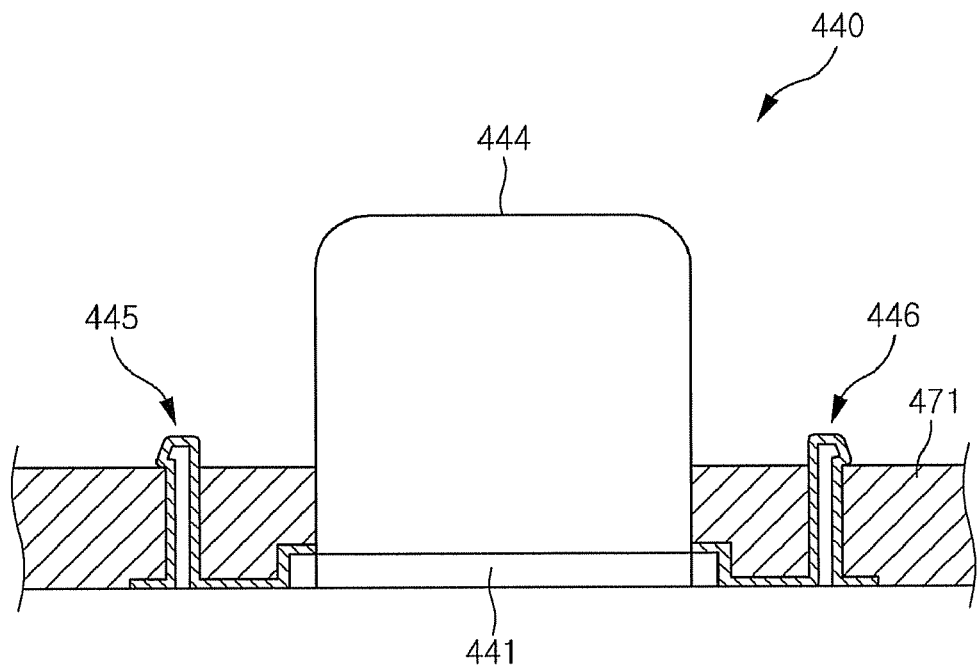
FIG. 8B is a cross-sectional view of the light emitting diode shown in FIG. 8A and a printed circuit board that are united with each other.

FIG. 8A is a perspective view of another exemplary embodiment of a light emitting diode according to the present invention, and FIG. 8B is a cross-sectional view of the light emitting diode shown in FIG. 8A and a printed circuit board that are united with each other. A light emitting diode of FIGS. 8A and 8B has substantially the same structure as the light emitting diode of FIG. 1-, except for the shape of a head portion. Accordingly, only the differences between the light emitting will be described below.

Referring to FIGS. 8A and 8B, a light emitting diode 440 includes a substrate 441, a light emitting chip, wires, a molding part 444, a first lead terminal 445, and a second lead terminal 446.

The first lead terminal 445 includes a first base part 445a and a first fitting part that protrudes from the first base part 445a. The first fitting part includes a first protruding portion 445b and a first head portion 445c. The first protruding portion 445b protrudes from the first base part 445a toward the upper side, e.g., toward the molding part 444. The first head portion 445c is formed at the distal end of the first protruding portion 445b. The first protruding portion 445b includes a first body $445b_1$, and a second body $445b_2$ spaced apart from the first body $445b_1$ (e.g., in a horizontal direction).

The second lead terminal 446 is symmetric with the first lead terminal 445. The second lead terminal 446 includes a second base part 446a and a second fitting part that protrudes from the second base part 446a. The second fitting part includes a second protruding portion 446b that protrudes from the second base part 446a toward the upper side, e.g., toward the molding part 444, and a second head portion 446c formed at the end of the second protruding portion 446b. The second protruding portion 446b includes a third body $446b_3$, and a fourth body $446b_4$ spaced apart from the third body $446b_3$.

As in the illustrated embodiment, the first head portion 445c has a shape in which a width is gradually decreased from one end toward the other end, e.g. in a direction from the first base part 445a to the distal end of the first protruding portion 445b. Unlike the first head portion 415c in FIG. 1 and, the first head portion 445c of FIGS. 8A and 8B is formed unsymmetrically with respect to a central (vertical) axis. The first head portion 445c is considered to have a profile in the shape of a hook, whereby one side is substantially flat or vertical and an opposing side of the first head portion 445c is tapered.

Figure 9A:
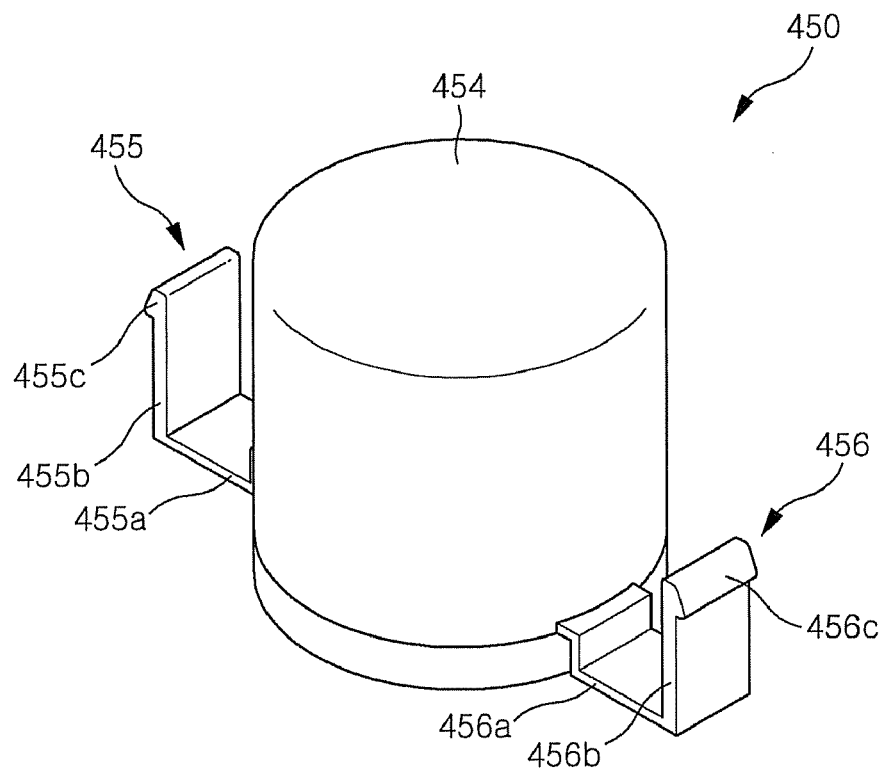
FIG. 9A is a perspective view of another exemplary embodiment of a light emitting diode according to the present invention.
Figure 9B:
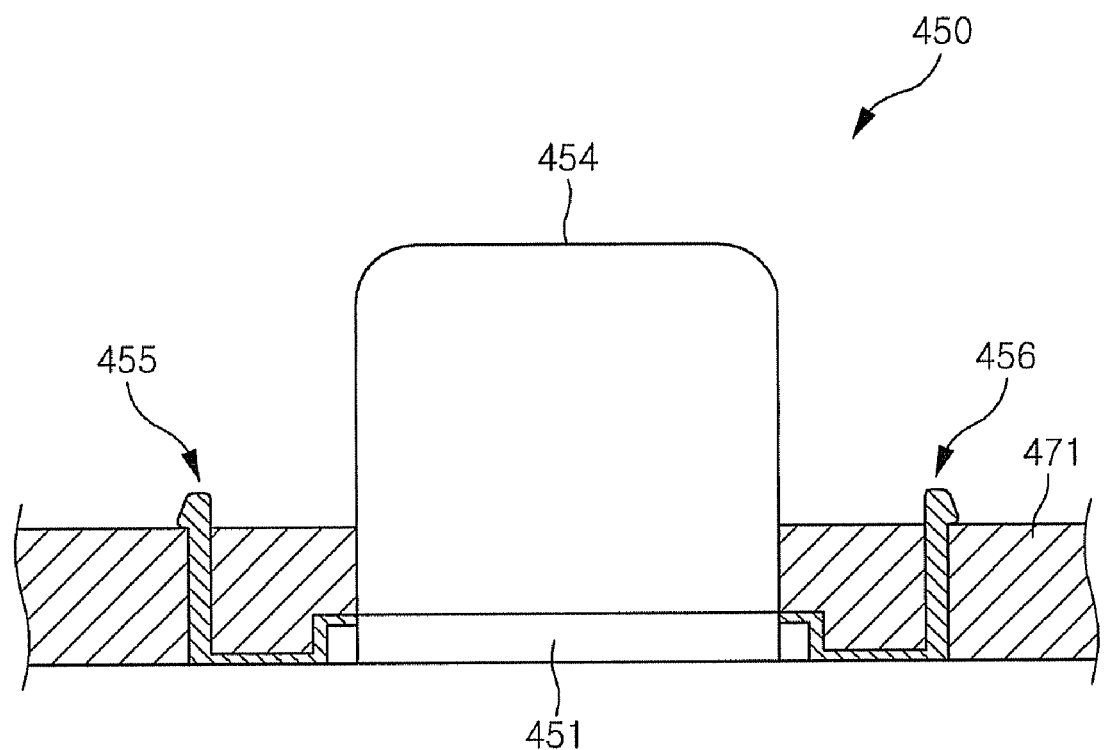
FIG. 9B is a cross-sectional view of the light emitting diode shown in FIG. 9A and a printed circuit board that are united with each other.

FIG. 9A is a perspective view of another exemplary embodiment of a light emitting diode according to the present invention, and FIG. 9B is a cross-sectional view of the light emitting diode shown in FIG. 9A and a printed circuit board that are united with each other.

Referring to FIGS. 9A and 9B, a light emitting diode 450 includes a substrate 451, a light emitting chip, wires, a molding part 454, a first lead terminal 455, and a second lead terminal 456.

The first lead terminal 455 includes a first base part 455a and a first fitting part that protrudes from the first base part 455a. The first fitting part includes a first protruding portion 455b and a first head portion 455c. The first protruding portion 455b extends from the end of the first base part 455a and is bent toward the upper side of the LED 450 from the first base part 455a and toward the molding part 454. The first head portion 455c is formed at the end of the first protruding portion 455b.

In the illustrated embodiment, the first head portion 455c has a shape in which a width is gradually decreased from one end toward the other end, e.g., in a direction from the first base part 455a toward the distal end of the first protruding portion 455b. One surface of the head portion 455c is flat and the other surface thereof is inclined. The flat surface is on an inner aide of the first head portion 455c, but the invention is not limited thereto. Alternatively, the flat side of the first head portion 455c may be out the outermost side of the first head portion 455c relative to the LED 459. The first head portion 455c passes through the first fitting hole 475 of the printed circuit board 470, and fits the first lead terminal 455 to the printed circuit board.

The second lead terminal 456 includes a first base part 456a and a first fitting part that protrudes from the first base part 456a. The first fitting part includes a first protruding portion 456b and a first head portion 456c. The first protruding portion 456b extends from the end of the first base part 456a and is bent toward the upper side of the LED 450 from the first base part 456 and toward the molding part 454. The first head portion 456c is formed at the end of the first protruding portion 456b.

Figure 10:
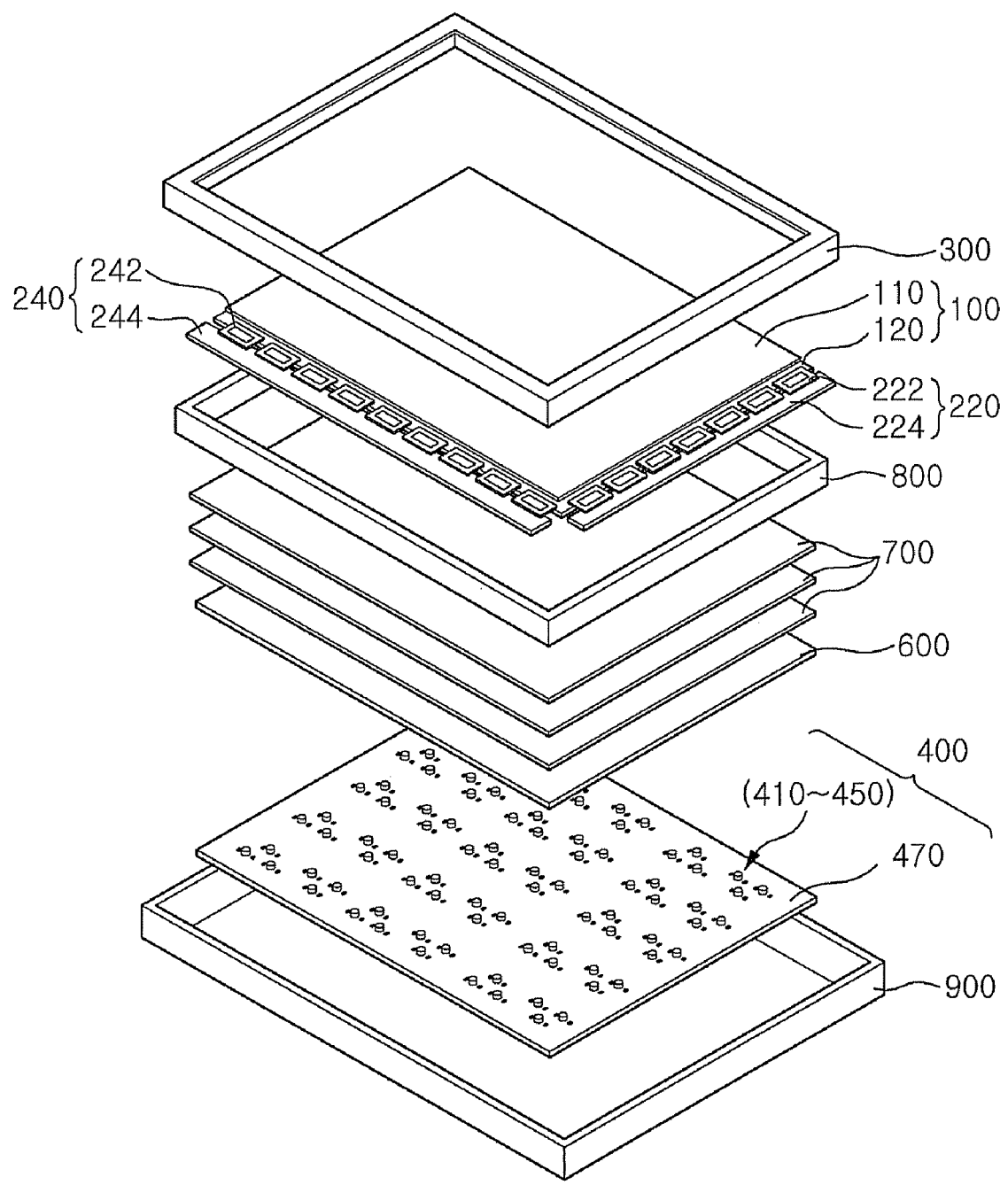
FIG. 10 is an exploded perspective view of an exemplary embodiment of a liquid crystal display that includes a light source unit according to the present invention.

FIG. 10 is an exploded perspective view of an exemplary embodiment of a liquid crystal display that includes a light source unit according to the present invention.

Referring to FIG. 10, a liquid crystal display includes an upper sash 300, a liquid crystal panel 100, driving circuit units 220 and 240, a diffusion plate 600, a plurality of optical sheets 700, a light source unit 400, a mold frame 800, and a lower sash 900.

A predetermined receiving space is formed in the mold frame 800. A backlight unit, which includes the diffusion plate 600, the plurality of optical sheets 700, and the light source unit 400, is disposed in the receiving space of the mold frame 800. The liquid crystal panel 100 displaying images is disposed above the backlight unit.

The driving circuit unit 220 includes a gate printed circuit board 224 and a flexible gate printed circuit board 222. The driving circuit unit 240 includes a flexible data printed circuit board 242 and a data printed circuit board 244. The gate printed circuit board 224 is connected to the liquid crystal panel 100, includes control ICs (integrated circuits) mounted thereon, and supplies predetermined gate signals to gate lines of a TFT substrate 120.

The data printed circuit board 244 includes control ICs mounted thereon, and supplies predetermined data signals to data lines of the TFT substrate 120. The flexible gate printed circuit board 222 connects the TFT substrate 120 with the gate printed circuit board 224, and the flexible data printed circuit board 242 connects the TFT substrate 120 with the data printed circuit board 244. The gate and data printed circuit boards 224 and 244 are connected to the flexible gate printed circuit board 222 and the data printed circuit board 242, respectively, to supply gate driving signals and external image signals. In an exemplary embodiment, the gate and data printed circuit boards 224 and 244 may be integrated as one printed circuit board. As used herein, "integrated" is used to mean that the gate and data printed circuit boards are a single unit. Each of the flexible printed circuit boards 222 and 242 includes a driving IC mounted thereon to transmit RGB (Red, Green, and Blue) signals and electrical power, which are generated from the printed circuit boards 224 and 244, to the liquid crystal panel 100.

The light source unit 400 includes light emitting diodes, such as light emitting diodes 410, 420, 430, 440 and/or 450 of the illustrated embodiments in FIGS. 1-9, and a printed circuit board 470. Each of the light emitting diodes 410 to 450 includes the above-mentioned fitting parts, and is fitted to the printed circuit board 470 so as to be mounted on the printed circuit board 470.

The diffusion plate 600 and the plurality of optical sheets 700 are disposed above the light source unit 400 to create a uniform brightness distribution of light emitted from the light source unit 400. In an exemplary embodiment, the optical sheets 700 may include, but are not limited to, a prism sheet and a diffusion sheet. The upper sash 300 is united with the mold frame 800 so as to cover edge portions (e.g., non-display regions) of the liquid crystal panel 100 and side and lower surfaces of the mold frame 800. The lower sash 900 is provided below the mold frame 800 and closes the receiving space of the mold frame 800.

A light source unit according to the illustrated embodiments of the present invention, and a backlight unit and liquid crystal display including the light source unit have been described above. However, the present invention is not limited to the above-mentioned embodiments, and it will be apparent to those skilled in the art that various modifications and changes may be made thereto without departing from the scope and spirit of the present invention, as claimed in the following claims.

As in the illustrated embodiments, when a light emitting diode is mounted on a printed circuit board, the light emitting diode is fitted to the printed circuit board so as to be mounted on the printed circuit board without having to solder as described above. Accordingly, if defects occur in the light emitting diode mounted on the printed circuit board, it is possible to separate the defective light emitting diode from the printed circuit board and to replace the defective light emitting diode with another light emitting diode. Therefore, it is possible to perform rework. Advantageously, it is possible to reduce cost of materials and to reduce the manufacturing cost of the light source unit.

In addition, it is possible to mount a light emitting diode on a printed circuit board without using solder, which provides a light source unit meeting the standards of environmental regulations.

What is claimed is:

1. A light source unit comprising:
   light emitting diodes including a lead terminal, the lead terminal including a base part and a fitting part protruding from the base part; and
   a printed circuit board including a fitting hole,
   wherein the fitting part of the lead terminal is fitted into the fitting hole of the printed circuit board and the light emitting diode is mounted on the printed circuit board, the fitting part including:
      a protruding portion protruding from the base part in a first direction and is inserted into the fitting hole; and
      a head portion disposed at a distal end of the protruding portion and connecting the lead terminal of the light emitting diode to the printed circuit board.

2. The light source unit of claim 1, wherein the protruding portion includes a first body and a second body spaced apart from the first body,
   a first end of the first body is connected to a first end of the head portion, and a first end of the second body is connected to second end of the head portion, and
   the base part extends from a second end of the first body in a second direction, and extends from a second end of the second body in a third direction opposite to the second direction.

3. The light source unit of claim 1, wherein the protruding portion includes:
   a first body disposed on a surface of the base part; and
   a second body spaced apart from the first body and disposed on the surface of the base part.

4. The light source unit of claim 3, wherein the head portion connects a distal end of the first body and a distal end of the second body.

5. The light source unit of claim 3, wherein the head portion includes:
   a first head disposed at a distal end of the first body; and
   a second head disposed at a distal end of the second body.

6. The light source unit of claim 1, wherein the lead terminal includes a first lead terminal and a second lead terminal.

7. The light source unit of claim 6, wherein the head portion has a shape in which a width is gradually decreased from a first end of the head portion toward a second end of the head portion.

8. The light source unit of claim 6, wherein each of the lead terminals includes a plurality of fitting parts.

9. The light source unit of claim 6, wherein the fitting hole of the printed circuit board includes:
   a first fitting hole into which the fitting part of the first lead terminal is fitted;
   a second fitting hole into which the fitting part of the second lead terminal is fitted; and
   a third fitting hole through which a molding part or substrate of the light emitting diode passes.

10. The light source unit of claim 9, wherein the printed circuit board includes circuit patterns, and
    the first fitting hole and the second fitting hole are disposed in the circuit patterns.

11. The light source unit of claim 10, wherein the circuit patterns extend into the first fitting hole and the second fitting hole.

12. A backlight unit comprising:
    a light source unit including light emitting diodes and a printed circuit board in which a fitting hole is disposed, the light emitting diodes including a lead terminal, the lead terminal including a base part and a fitting part protruding from the base part, and the fitting part of the lead terminal fitted into the fitting hole of the printed circuit board and securing the light emitting diode to the printed circuit board, the fitting part including:
       a protruding portion protruding from the base part in a first direction and is inserted into the fitting hole; and
       a head portion disposed at a distal end of the protruding portion and connecting the lead terminal of the light emitting diode to the printed circuit board; and
    a receiving member in which the light source unit is received.

13. The backlight unit of claim 12, further comprising:
    a diffusion plate disposed on the light source unit; and
    a prism sheet disposed on the diffusion plate.

14. The backlight unit of claim 12, wherein the protruding portion includes a first body and a second body spaced apart from the first body,
    a first end of the first body is connected to a first end of the head portion, and a first end of the second body is connected to second end of the head portion, and
    the base part extends from a second end of the first body in a second direction, and extends from a second end of the second body in a third direction opposite to the second direction.

15. The backlight unit of claim 12, wherein the protruding portion includes:
    a first body disposed on a surface of the base part; and
    a second body spaced apart from the first body and disposed on the surface of the base part.

16. A liquid crystal display comprising:
    a light source unit including light emitting diodes and a printed circuit board in which a fitting hole is disposed, the light emitting diodes including a lead terminal, the lead terminal including a base part and a fitting part protruding from the base part, and the fitting part of the lead terminal fitted into the fitting hole of the printed circuit board and securing the light emitting diode to the printed circuit board, the fitting part including:
       a protruding portion protruding from the base part in a first direction and is inserted into the fitting hole; and
       a head portion disposed at a distal end of the protruding portion and connecting the lead terminal of the light emitting diode to the printed circuit board;
    a receiving member in which the light source unit is received; and
    a liquid crystal panel disposed above the light source unit and displaying images.

17. The liquid crystal display of claim 16, wherein the protruding portion includes a first body and a second body spaced apart from the first body,
    a first end of the first body is connected to a first end of the head portion, and a first end of the second body is connected to second end of the head portion, and
    the base part extends from a second end of the first body in a second direction, and extends from a second end of the second body in a third direction opposite to the second direction.

18. The liquid crystal display of claim 16, wherein the protruding portion includes:
    a first body disposed on a surface of the base part; and
    a second body spaced apart from the first body and disposed on the surface of the base part.

* * * * *